(12) United States Patent
Baek et al.

(10) Patent No.: US 10,978,595 B2
(45) Date of Patent: Apr. 13, 2021

(54) THIN-FILM TRANSISTOR-BASED PRESSURE SENSOR AND METHOD OF MANUFACTURING SAME

(71) Applicant: CENTER FOR ADVANCED SOFT ELECTRONICS, Pohang-si (KR)

(72) Inventors: Sanghoon Baek, Pohang-si (KR); Sungjune Jung, Pohang-si (KR); Jimin Kwon, Paju-si (KR); Geunyeol Bae, Yeosu-si (KR); Kilwon Cho, Pohang-si (KR)

(73) Assignee: CENTER FOR ADVANCED SOFT ELECTRONICS, Pohang-si (KR)

( * ) Notice: Subject to any disclaimer, the term of this patent is extended or adjusted under 35 U.S.C. 154(b) by 0 days.

(21) Appl. No.: 16/364,566

(22) Filed: Mar. 26, 2019

(65) Prior Publication Data
US 2019/0305139 A1 Oct. 3, 2019

(30) Foreign Application Priority Data
Mar. 29, 2018 (KR) ........................ 10-2018-0036672

(51) Int. Cl.
*H01L 29/84* (2006.01)
*H01L 29/786* (2006.01)
(Continued)

(52) U.S. Cl.
CPC .......... *H01L 29/84* (2013.01); *H01L 29/7869* (2013.01); *H01L 51/0036* (2013.01); *H01L 51/052* (2013.01)

(58) Field of Classification Search
CPC combination set(s) only.
See application file for complete search history.

(56) References Cited

U.S. PATENT DOCUMENTS

2009/0199648 A1* 8/2009 Sung ..................... G01L 9/0098
73/754
2013/0167494 A1* 7/2013 Shimazaki ......... B01D 46/0002
55/492

(Continued)

FOREIGN PATENT DOCUMENTS

JP 2009031045 A 2/2009
JP 2013016778 A 1/2013

(Continued)

OTHER PUBLICATIONS

Office action from Korean intellectual Property Office of 10-2018-0036672, dated May 17, 2019 I I.

(Continued)

*Primary Examiner* — Ratisha Mehta
(74) *Attorney, Agent, or Firm* — STIP Law Group, LLC

(57) ABSTRACT

Disclosed is a thin-film transistor-based pressure sensor including a gate electrode; a gate dielectric layer provided on the gate electrode; a semiconductor layer provided on the gate dielectric layer; and a source electrode and a drain electrode provided on the semiconductor layer, wherein each of the source and drain electrodes has an elastic body that includes: an elastic part having a protrusion; and a conductive part provided on a surface of the elastic part and having a conductive material. According to the pressure sensor and a method of manufacturing the same of the present invention, the elastic body coated with the conductive material is patterned to serve as the source electrode and the drain electrode of the pressure sensor whereby it is possible to drive an active matrix, drive the pressure sensor with low power, and manufacture the pressure sensor through a simple process.

18 Claims, 12 Drawing Sheets

(51) Int. Cl.
    *H01L 51/00*     (2006.01)
    *H01L 51/05*     (2006.01)

(56) References Cited

U.S. PATENT DOCUMENTS

| | | | |
|---|---|---|---|
| 2016/0056415 A1* | 2/2016 | Yoo | H01L 51/5281 |
| | | | 349/43 |
| 2016/0178460 A1* | 6/2016 | Ogura | G01L 1/142 |
| | | | 73/862.626 |
| 2018/0134546 A1* | 5/2018 | Oh | B81C 1/0023 |

FOREIGN PATENT DOCUMENTS

| | | |
|---|---|---|
| JP | 2017219336 A | 12/2017 |
| KR | 1020150028125 A | 3/2015 |

OTHER PUBLICATIONS

Sanghoon Baek et al, Flexible Pressure-Sensitive Contact Transistors Operating in the Subthreshold Regime, Applied Materials & Interfaces, Aug. 2, 2019, vol. 11, pp. 31111-31118, ACS Publications, Washington D.C., USA.

Dario Natali et al, Injection Length in Staggered Organic Thin Film Transistors: Assessment and Implications for Device Downscalling, Advanced Electronic Materials, Jul. 13, 2016, vol. 2, Issue 1600097, Wiley-VCH Verlag GmbH & Co, Weinheim, Germany.

\* cited by examiner

Before loading 5.7kPa loading 5.7 kPa loading

THIN-FILM TRANSISTOR-BASED PRESSURE SENSOR AND METHOD OF MANUFACTURING SAME

CROSS REFERENCE TO RELATED APPLICATION

The present application claims priority to Korean Patent Application No. 10-2018-0036672, filed Mar. 29, 2018, the entire contents of which is incorporated herein for all purposes by this reference.

BACKGROUND OF THE INVENTION

Field of the Invention

The present invention relates to a thin-film transistor-based pressure sensor and a method of manufacturing the same. More particularly, the present invention relates to a thin-film transistor-based pressure sensor and a method of manufacturing the same, the pressure sensor being configured such that an elastic body coated with a conductive material is patterned to serve as a source and a drain electrode of the pressure sensor.

Description of the Related Art

Human skin is an organ that communicates with the external environment and provides information such as pressure, temperature, and humidity through touch. Much research on electronic skin (E-skin) to mimic human skin system has been carried out, and research on electronic skin sensor which converts information such as pressure, temperature, and humidity into electronic signals through electronic skin is actively under way. Advances in electronic skin find application in various fields such as robotics, medical diagnosis, prosthetics, and wearable health monitoring instruments. Since human skin is soft, such electronic skin is required to be made on a soft and flexible substrate with a large area.

In particular, research on a pressure sensor that converts pressure information into an electrical signal has been actively conducted so that pressure sensors have been manufactured in various ways. One of commonly used sensing methods is the piezo-capacitive method, which is also used in touch panels. As pressure is applied in a plate capacitor model in which a dielectric layer is interposed between two plates, a distance between two plates is shortened, thereby increasing capacitance.

Although the method is advantageous in that the principle is simple and fabrication and analysis are easy, it is disadvantageous in that the initial area is small when miniaturizing a sensor whereby the initial capacitance value is small and the signal-to-noise ratio is not good.

Another sensing method is the piezo-resistive method in which the resistance between two materials is changed when applying pressure. Although the principle is simple, it is disadvantageous in that current is increased due to the pressure, thereby consuming more electrical power.

As described above, a passive matrix method in which multiple electrodes are crossed over each other is used for pressure sensors using a change in capacitance or in resistance in accordance with pressure in order to fabricate a large area. The passive matrix is disadvantageous in that independent control of each pixel is difficult and the operation speed is slow.

SUMMARY OF THE INVENTION

Accordingly, the present invention has been made keeping in mind the above problems occurring in the related art, and an objective of the present invention is to provide a thin-film transistor-based pressure sensor, which is configured such that an elastic body coated with a conductive material is patterned to serve as a source and a drain electrode of the pressure sensor.

Another objective of the present invention is to provide a thin-film transistor-based pressure sensor being capable of being driven in an active matrix in a large area compared with a passive matrix of a conventional resistance or capacitance pressure sensor.

Still another objective of the present invention to provide a thin-film transistor-based pressure sensor being capable of operating in a subthreshold regime where contact resistance is large and dominant such that the pressure sensor has high sensitivity and is driven by significantly lower power compared with a high-power pressure sensor using a conventional thin-film transistor.

Still another objective of the present invention is to provide a method of manufacturing a thin-film transistor-based pressure sensor, the method being capable of manufacturing a thin-film transistor-based pressure sensor through a simple process.

In order to achieve the above objectives, according to one aspect of the present invention, there is provided a pressure sensor including: a gate electrode; a gate dielectric layer provided on the gate electrode and having a dielectric; a semiconductor layer provided on the gate dielectric layer and having a semiconductor; and a source electrode and a drain electrode provided on the semiconductor layer. The source electrode has an elastic body that includes: a first elastic part having a first protrusion that protrudes toward the semiconductor layer; and a first conductive part provided on a surface of the first elastic part and having a conductive material. The drain electrode has an elastic body that includes: a second elastic part having a second protrusion that protrudes toward the semiconductor layer; and a second conductive part provided on a surface of the second elastic part and having a conductive material.

Each of the first protrusion and the second protrusion may have a shape whose cross-sectional area becomes smaller as each of the first protrusion and the second protrusion approaches the semiconductor layer.

At least one of the first protrusion and the second protrusion may be independently deformed as contraction pressure acts in a direction perpendicular to the first or second conductive part whereby a contact area between the semiconductor and the at least one of the first protrusion and the second protrusion is increased.

Each of the first protrusion and the second protrusion may have a shape of a cone, an elliptic cone, a polygonal pyramid, a truncated cone, a truncated elliptic cone, or a polygonal prism.

The elastic body may include at least one selected among the group consisting of polydimethylsiloxane (PDMS), ecoflex, silicone rubber, fluorosilicone rubber, vinyl methyl silicone rubber, styrene-butadiene rubber, styrene-ethylene-butylene-styrene rubber, acryl rubber, butadiene rubber, chloro isobutylene isoprene rubber, polychloroprene rubber, epichlorohydrin rubber, ethylene propylene rubber, ethylene propylene diene rubber, polyether urethane rubber, polyisoprene rubber, isobutylene isoprene butyl rubber, acrylonitrile butadiene rubber, and polyurethane rubber.

The elastic body may have an elastic modulus of 1 MPa to 1,000 MPa.

The conductive material may include at least one selected among the group consisting of carbon nanotube (CNT), carbon black, graphene, graphite, poly(3,4-ethylenedioxythiophene) (PEDOT), aluminium (Al), gold (Au), copper (Cu), silver (Ag), titanium (Ti), and platinum (Pt).

The pressure sensor may be configured such that current of the drain electrode is changed as a contact area between the protrusion and the semiconductor layer varies according to change in pressure.

The pressure sensor may operate in a subthreshold regime and sense pressure.

The pressure sensor may operate in the subthreshold regime and sense pressure, thereby having high sensitivity and being driven by low power.

The pressure sensor may further include: a substrate on a surface of the gate electrode, the surface being opposite to the gate dielectric layer.

The substrate may include at least one selected among the group consisting of silicon, glass, polymer, and metal.

The polymer may include at least one selected among the group consisting of poly(ethylene 2,6-naphthalate) (PEN), poly(ethylene terephthalate) (PET), polyimide (PI), polyethersulfone, polyacrylate, polyetherimide, polyphenylene sulfide, polyarylate, polyimide, polycarbonate, cellulose triacetate, and cellulose acetate propionate.

The gate electrode may include at least one selected among the group consisting of aluminium (Al), gold (Au), copper (Cu), silver (Ag), titanium (Ti), platinum (Pt), graphene, carbon nanotube (CNT), PEDOT: PSS, and silver nanowire.

The gate dielectric layer may include at least one selected among the group consisting of parylene, polydimethylsiloxane (PDMS), Cytop, polystyrene (PS), poly(methyl methacrylate) (PMMA), poly(vinyl pyrrolidone) (PVP), polyimide (PI), $SiO_2$, $Al_2O_3$, $HfO_2$, $ZrO_2$, $Y_2O_3$, and $Ta_2O_5$.

The semiconductor layer may include at least one selected among the group consisting of an n-type organic semiconductor, a p-type organic semiconductor, and an oxide semiconductor.

In order to achieve the above objectives, according to another aspect of the present invention, there is provided a pressure sensor including: a gate electrode; a gate dielectric layer provided on the gate electrode and having a dielectric; a semiconductor layer provided on the gate dielectric layer and having a semiconductor; and a patterned source electrode and a patterned drain electrode provided on the semiconductor layer. The patterned source electrode has an elastic body that includes: a first patterned elastic part having a first protrusion that protrudes toward the semiconductor layer; and a first conductive part provided on a surface of the first patterned elastic part and having a conductive material. The patterned drain electrode has an elastic body that includes: a second patterned elastic part having a second protrusion that protrudes toward the semiconductor layer; and a second conductive part provided on a surface of the second patterned elastic part and having a conductive material.

In order to achieve the above objectives, according to still another aspect of the present invention, there is provided a method of manufacturing a pressure sensor, the method including: forming a gate electrode; forming a gate dielectric layer having a dielectric on the gate electrode; forming a semiconductor layer having a semiconductor on the gate dielectric layer such that a first portion in which the gate electrode, the gate dielectric layer, and the semiconductor layer are configured sequentially is provided; forming a source electrode and a drain electrode such that a second portion in which the source electrode and the drain electrode are configured is provided; and positioning the second portion on the semiconductor layer of the first portion such that a pressure sensor is manufactured. The source electrode has an elastic body that includes: a first elastic part having a first protrusion that protrudes toward the semiconductor layer; and a first conductive part provided on a surface of the first elastic part and having a conductive material. The drain electrode has an elastic body that includes: a second elastic part having a second protrusion that protrudes toward the semiconductor layer; and a second conductive part provided on a surface of the second elastic part and having a conductive material.

The forming of the source electrode and the drain electrode may include: introducing an elastic substance into a mold having a pattern to form the elastic part included in the elastic body and having the protrusion; and coating a surface of the elastic part having the protrusion with a conductive material to form the conductive part including the conductive material on the surface of the elastic part such that the source electrode and the drain electrode are manufactured.

The coating of the elastic part may be performed by any one of method selected from spray coating, sputtering, spin coating, thermal evaporation, electroless plating, and transferring of electrode layer.

According to the present invention, an elastic body coated with a conductive material is patterned whereby the elastic body can serve as a source and a drain electrode of a thin-film transistor-based pressure sensor.

In addition, by using the thin-film transistor-based pressure sensor, it is possible to drive an active matrix in large area compared with a passive matrix of the conventional resistance or capacitance pressure sensor.

In addition, by using the thin-film transistor-based pressure sensor, it is possible to achieve high sensitivity by driving the pressure sensor in a subthreshold regime where the contact resistance is large and dominant, and drive the pressure sensor with significantly lower power compared with a high-power pressure sensor using a conventional thin-film transistor.

In addition, the thin film transistor-based pressure sensor can be manufactured through a simple process.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Reference will now be made in detail to exemplary embodiments of the present invention, specific examples of which are illustrated in the accompanying drawings and described below, since the embodiments of the present invention can be variously modified in many different forms. While the present invention will be described in conjunction with the exemplary embodiments thereof, it is to be understood that the present description is not intended to limit the present invention to those exemplary embodiments. On the contrary, the present invention is intended to cover not only the exemplary embodiments, but also various alternatives, modifications, equivalents, and other embodiments that may be included within the spirit and scope of the present invention as defined by the appended claims. However, in the following description, it is to be noted that, when the functions of conventional elements and the detailed description of elements related with the present invention may make the gist of the present invention unclear, a detailed description of those elements will be omitted.

It will be understood that, although the terms first, second, etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Further, it will be understood that when an element is referred to as being "formed", "layered", or "on" another element, it can be formed or layered so as to be directly attached to the entire surface or one surface of the other element, or intervening elements may be present therebetween.

As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Figure 1A:
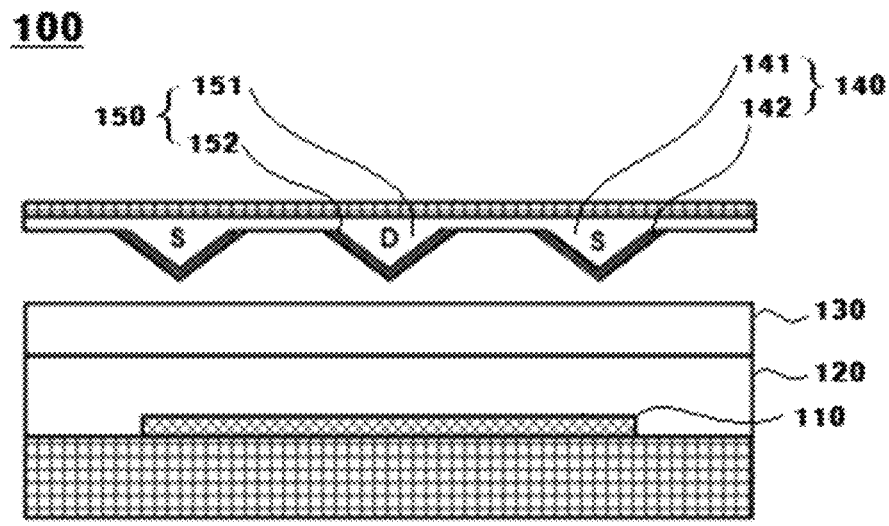
FIG. 1A is a cross-sectional view of a pressure sensor according to the present invention.
Figure 1B:
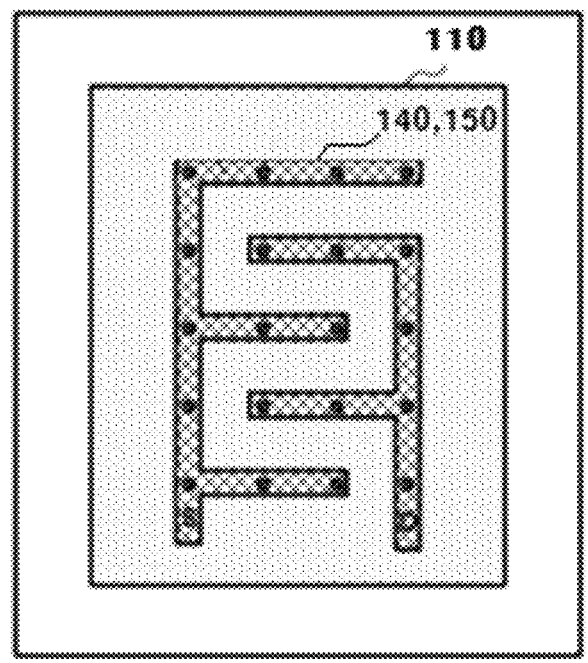
FIG. 1B is a plan view of the pressure sensor according to the present invention.
Figure 1C:
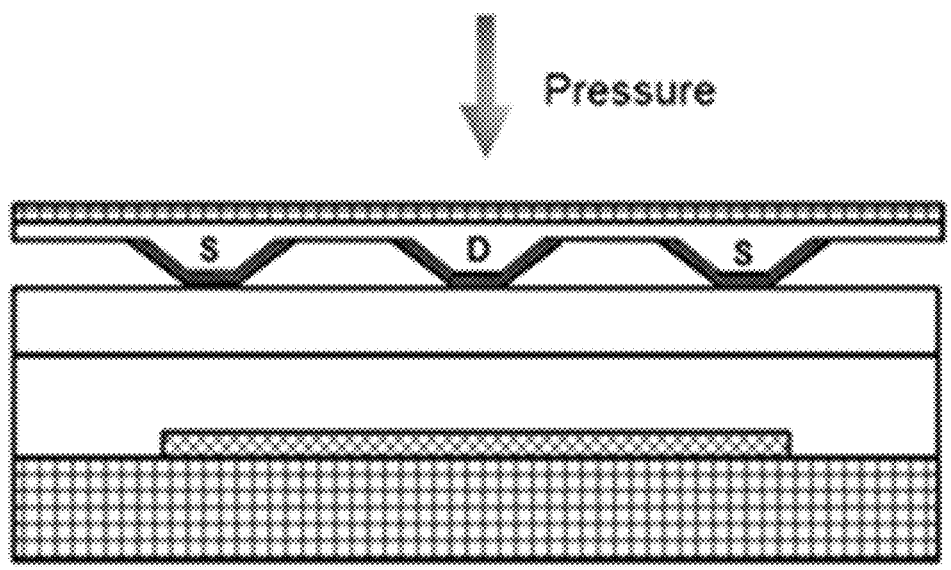
FIG. 1C is a cross-sectional view of a state in which a contact area between source and drain electrodes and a semiconductor layer is increased when pressure is applied to the pressure sensor according to the present invention.
Figure 1D:
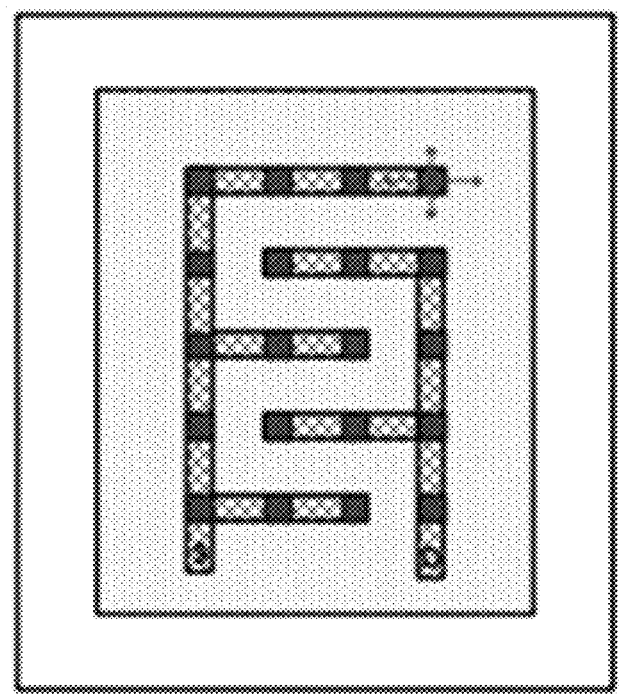
FIG. 1D is a plan view of the state in which the contact area between the source electrode and drain electrodes and the semiconductor layer is increased when pressure is applied to the pressure sensor according to the present invention.

FIGS. 1A to 1D are schematic diagrams of a pressure sensor according to the present invention, wherein FIGS. 1A and 1C are cross-sectional views and FIGS. 1B and 1D are plan views. FIGS. 1A and 1B illustrate that an elastic body including an elastic part and a conductive part serves as electrodes of a thin-film transistor before pressure is applied; and FIGS. 1C and 1D illustrate a state in which a contact area between the electrodes and a semiconductor layer is increased due to the application of pressure.

Referring to FIG. 1B, a source electrode 140 and a drain electrode 150 are formed by patterning. The source electrode 140 has an elastic part 141, which has a protrusion, and a conductive part 142 formed on a surface of the elastic part 141, and the drain electrode 150 has an elastic part 151, which has a protrusion, and a conductive part 152 formed on a surface of the elastic part 152. Circular black dots shown in the plan view represent the protrusions, and hatched parts represent the conductive parts having a conductive material formed on the surfaces of the elastic parts.

Hereinafter, the present invention will be described in detail with reference to FIGS. 1A to 1D. However, the description should be regarded as illustrative rather than restrictive, and the present invention is only defined by the scope of the following claims.

The present invention provides a pressure sensor 100 including: a gate electrode 110; a gate dielectric layer 120 provided on the gate electrode 110 and having a dielectric; a semiconductor layer 130 provided on the gate dielectric layer 120 and having a semiconductor; and the source electrode 140 and the drain electrode 150 provided on the semiconductor layer 130. The source electrode 140 has an elastic body that includes: a first elastic part 141 having a first protrusion that protrudes toward the semiconductor layer; and a first conductive part 142 provided on a surface of the first elastic part and having a conductive material. The drain electrode 150 has an elastic body that includes: a second elastic part 151 having a second protrusion that protrudes toward the semiconductor layer; and a second conductive part 152 provided on a surface of the second elastic part and having a conductive material.

Each of the first protrusion and the second protrusion may have a shape whose cross-sectional area becomes smaller as each of the first protrusion and the second protrusion approaches the semiconductor layer.

At least one of the first protrusion and the second protrusion is independently deformed as contraction pressure acts in a direction perpendicular to the first or second conductive part whereby a contact area between the semiconductor and at least one of the first protrusion and the second protrusion may be increased.

Each of the first protrusion and the second protrusion may have a shape of a cone, an elliptic cone, a polygonal pyramid, a truncated cone, a truncated elliptic cone, or a polygonal prism.

The elastic body may include at least one selected among the group consisting of polydimethylsiloxane (PDMS), ecoflex, silicone rubber, fluorosilicone rubber, vinyl methyl silicone rubber, styrene-butadiene rubber, styrene-ethylene-butylene-styrene rubber, acryl rubber, butadiene rubber, chloro isobutylene isoprene rubber, polychloroprene rubber, epichlorohydrin rubber, ethylene propylene rubber, ethylene propylene diene rubber, polyether urethane rubber, polyisoprene rubber, isobutylene isoprene butyl rubber, acrylonitrile butadiene rubber, and polyurethane rubber.

The elastic body may have an elastic modulus of 1 MPa to 1,000 MPa.

The conductive material may include at least one selected among the group consisting of carbon nanotube (CNT), carbon black, graphene, graphite, poly(3,4-ethylenedioxythiophene) (PEDOT), aluminium (Al), gold (Au), copper (Cu), silver (Ag), titanium (Ti), and platinum (Pt).

In the pressure sensor, a contact area between the protrusions and the semiconductor layer varies according to changes in pressure such that current of the drain electrode may be changed.

Figure 2A:
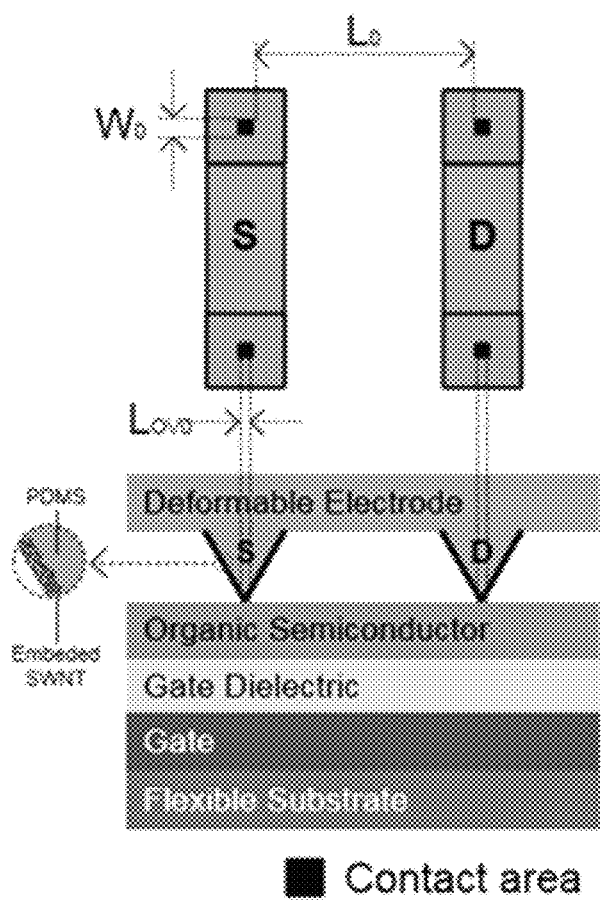
FIGS. 2A and 2B are side views of the pressure sensor according to the present invention.
Figure 2B:
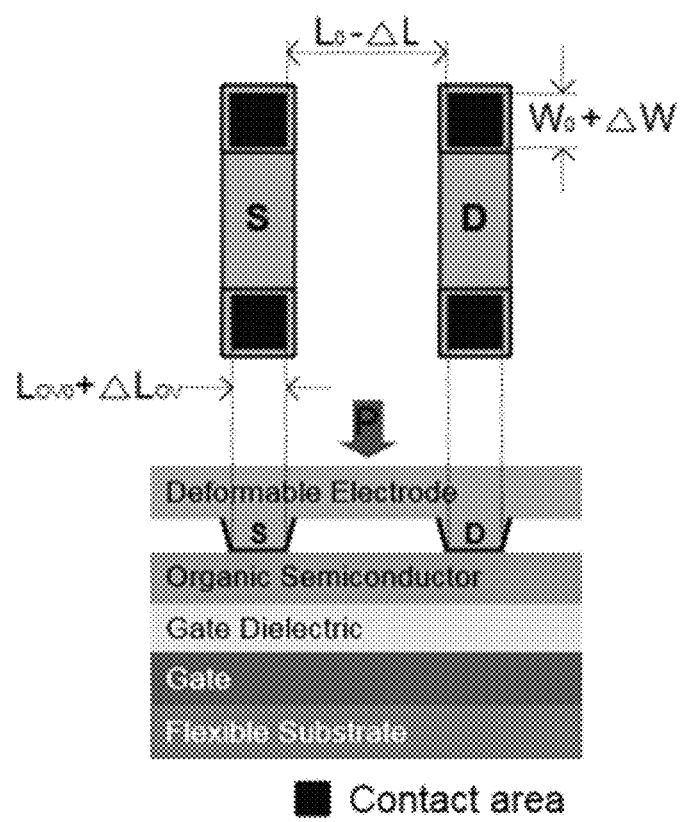

FIGS. 2A and 2B are side views of the pressure sensor according to the present invention, and show mechanism of the pressure sensor wherein a channel length (L) and a width (W) of the transistor and an overlap length (Lov) between the source and drain electrodes and the gate electrode are changed as pressure is applied such that drain current is increased.

In addition, FIGS. 4A to 4D are views illustrating a state in which the contact area is increased due to deformation of the electrode when pressure is applied to the pressure sensor according to the present invention.

Referring to FIGS. 2A, 2B, and 4A to 4D, when pressure is applied to the pressure sensor, the drain current changes due to a change in the contact area between the source and drain electrodes and the semiconductor layer whereby it is possible to measure the pressure. When the pressure is applied to the pressure sensor, the source and drain electrodes are deformed such that the contact area with the semiconductor layer of the thin-film transistor is increased. Thus, the drain current is increased whereby it is possible to measure the pressure.

In addition, the pressure sensor is capable of being driven in an active matrix. In general, a passive matrix method in which multiple electrodes are crossed each other is used for pressure sensors using a change in capacitance or in resistance in accordance with pressure in order to fabricate a large area. The passive matrix is disadvantageous in that independent control of each pixel is difficult and the operation speed is slow. However, since the present invention manufactures a thin-film transistor-based pressure sensor, an active matrix-pressure sensor having a large area can be driven.

The pressure sensor operates in a subthreshold regime and senses pressure.

Since the pressure sensor operates in the subthreshold regime and senses pressure, the pressure sensor can have high sensitivity and be driven by low power.

The pressure sensor may further include a substrate on a surface of the gate electrode opposite to the gate dielectric layer.

The substrate may include at least one selected among the group consisting of silicon, glass, polymer, and metal.

The polymer may include at least one selected among the group consisting of poly(ethylene 2,6-naphthalate) (PEN), poly(ethylene terephthalate) (PET), polyimide (PI), polyethersulfone, polyacrylate, polyetherimide, polyphenylene sulfide, polyarylate, polyimide, polycarbonate, cellulose triacetate, and cellulose acetate propionate. In order to apply the pressure sensor on an electronic skin, it is preferable to use a flexible substrate made of a soft material such as PEN, PET, and PI.

The gate electrode 110 may include at least one selected among the group consisting of Al, Au, Cu, Ag, Ti, Pt, graphene, CNT, PEDOT:PSS, and silver nanowire. The gate electrode 110 may be fabricated into a thin film by performing physical vapor deposition (PVD) such as thermal evaporation and sputtering, or atmospheric pressure chemical vapor deposition (APCVD), low-pressure chemical vapor deposition (LPCVD), plasma-enhanced chemical vapor deposition (PECVD), or printing.

The gate dielectric layer 120 may include at least one selected among the group consisting of parylene, PDMS, Cytop, polystyrene (PS), poly(methyl methacrylate) (PMMA), poly(vinyl pyrrolidone) (PVP), polyimide (PI), $SiO_2$, $Al_2O_3$, $HfO_2$, $ZrO_2$, $Y_2O_3$, and $Ta_2O_5$, and may include various organic and inorganic dielectric substances.

In addition, the gate dielectric layer 120 may be formed by performing chemical vapor deposition (CVD) or a solution process such as spin coating.

The semiconductor layer 130 may include at least one selected among the group consisting of an n-type organic semiconductor, a p-type organic semiconductor, and an oxide semiconductor.

In addition, the semiconductor layer 130 may be formed by performing a solution process such as spin coating and printing, PVD such as thermal evaporation and sputtering, LPCVD, or PECVD.

In addition, the present invention provides a pressure sensor including: a gate electrode; a gate dielectric layer provided on the gate electrode and having a dielectric; a semiconductor layer provided on the gate dielectric layer and having a semiconductor; and a patterned source electrode and a patterned drain electrode provided on the semiconductor layer. The patterned source electrode has an elastic body that includes: a first patterned elastic part having a first protrusion that protrudes toward the semiconductor layer; and a first conductive part provided on a surface of the first patterned elastic part and having a conductive material. The patterned drain electrode has an elastic body that includes: a second patterned elastic part having a second protrusion that protrudes toward the semiconductor layer; and a second conductive part provided on a surface of the second patterned elastic part and having a conductive material.

Figure 3A:
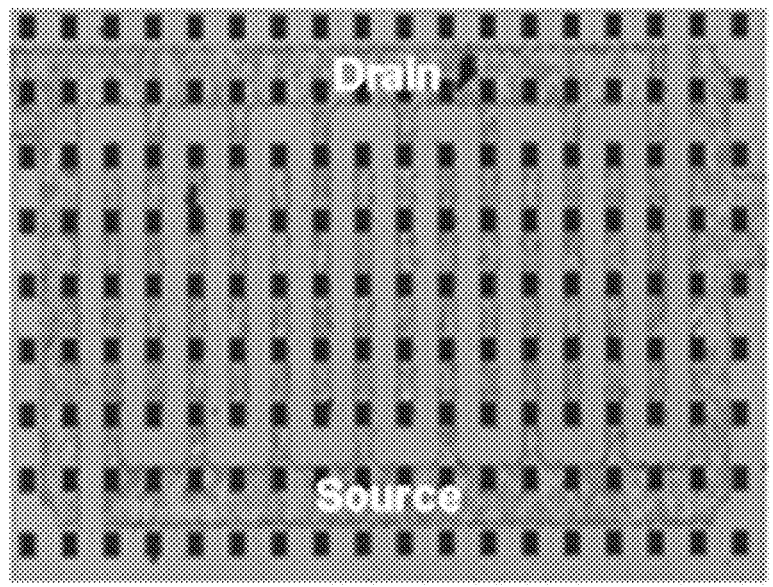
FIG. 3A is a view illustrating that an elastic body including an elastic part and a conductive part is patterned into a source electrode and a drain electrode of a transistor.
Figure 3B:
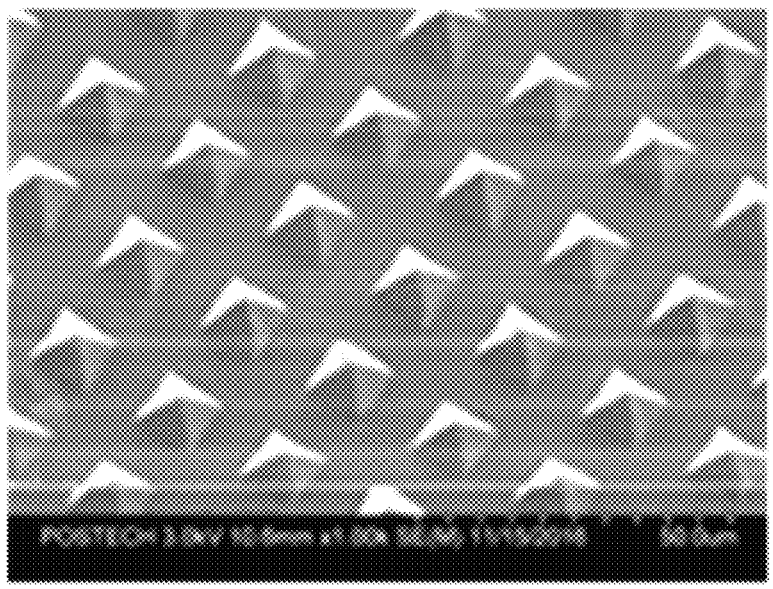
FIG. 3B is a scanning electron microscope (SEM) image of the elastic body including the elastic part and the conductive part.
Figure 4A:
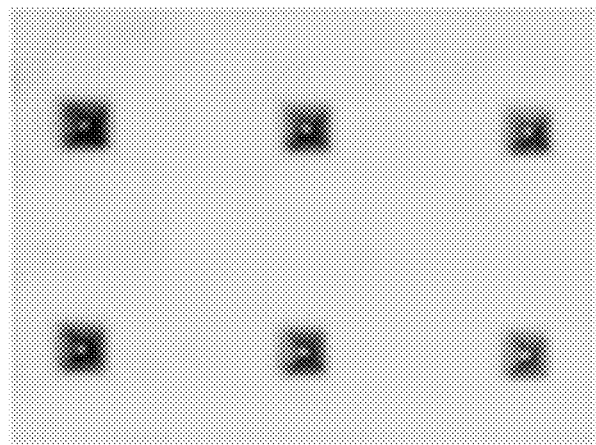
FIGS. 4A, 4B, 4C and 4D are views illustrating a state in which a contact area is increased due to deformation of the electrode when pressure is applied to the pressure sensor according to the present invention.
Figure 4B:
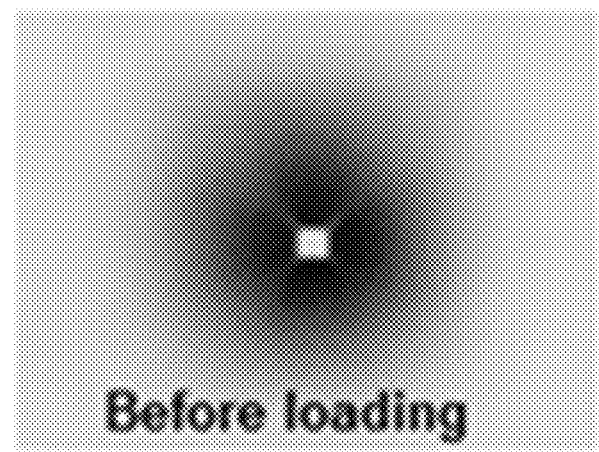
Figure 4C:
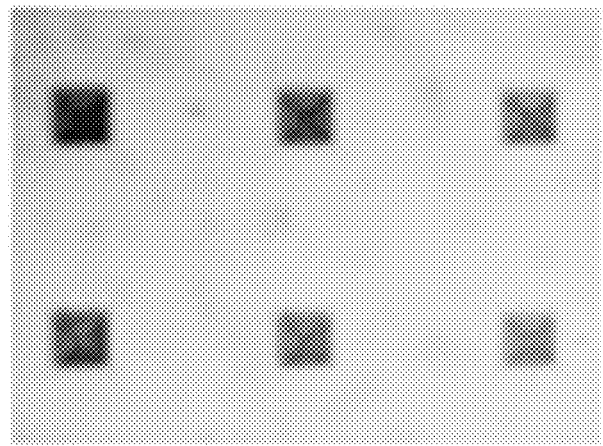
Figure 4D:
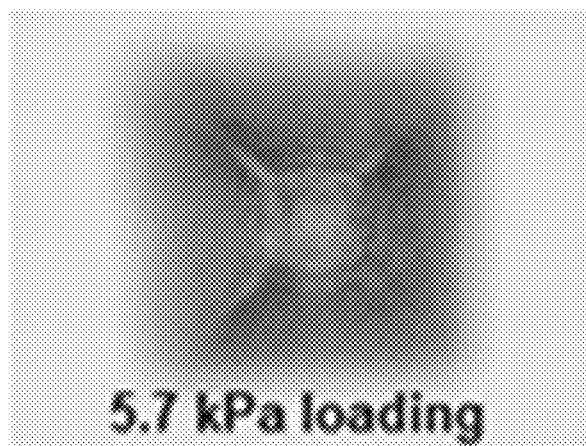

FIG. 3A is a diagram illustrating that the elastic body including the elastic part and the conductive part is patterned into the source electrode and the drain electrode of the transistor; and FIG. 3B is a scanning electron microscope (SEM) image of the elastic body including the elastic part and the conductive part.

Referring to FIGS. 3A and 3B, the patterned source electrode and the patterned drain electrode may be obtained through a laser process to be patterned into shapes of source and drain electrodes.

In addition, it is possible to control the performance of the sensor by adjusting an electrode shape, a channel length, and a channel width through the laser process.

In addition, the present invention provides a method of manufacturing a pressure sensor, the method including: (a) forming a gate electrode 110; (b) forming a gate dielectric layer 120 having a dielectric on the gate electrode 110; (c) forming a semiconductor layer 130 having a semiconductor on the gate dielectric layer 120 such that a first portion in which the gate electrode, the gate dielectric layer, and the semiconductor layer are configured sequentially is provided; (d) forming a source electrode 140 and a drain electrode 150 such that a second portion in which the source electrode and the drain electrode are configured is provided; and (e) positioning the second portion on the semiconductor layer of the first portion such that a pressure sensor is manufactured.

The source electrode 140 has an elastic body that includes: a first elastic part 141 having a first protrusion that protrudes toward the semiconductor layer; and a first conductive part 142 provided on a surface of the first elastic part and having a conductive material. The drain electrode 150 has an elastic body that includes: a second elastic part 151 having a second protrusion that protrudes toward the semiconductor layer; and a second conductive part 152 provided on a surface of the second elastic part and having a conductive material.

The (d) forming of the source electrode 140 and the drain electrode 150 may include: (d-1) introducing an elastic substance into a mold having a pattern to form the elastic part included in the elastic body and having the protrusion; and (d-2) coating a surface of the elastic part having the protrusion with a conductive material to form the conductive part including the conductive material on the surface of the elastic part such that the source electrode and the drain electrode are manufactured.

The (d-2) coating of the elastic part may be performed by any one of method selected from spray coating, sputtering, spin coating, thermal evaporation, electroless plating, and transferring of electrode layer.

Hereinafter, the present invention will be described in more detail with reference to an example. However, this is described only for illustrative purposes, and thus the scope of the present disclosure should not be construed as being limited to the following example

EXAMPLE

Example 1

Thin-Film Transistor-Based Pressure Sensor

A bottom gate was formed by thermal evaporation wherein aluminium (Al) is deposited on a flexible and biocompatible parylene substrate. A parylene thin-film serving as a gate insulating layer (gate dielectric layer) was formed on the bottom gate by chemical vapor deposition (CVD). A poly[3,6-bis(5-thiophen-2-yl)-2,5-bis(2-octyldodecyl)pyrrolo[3,4-c]pyrrole-1,4(2H,5H)-dione-2,2'-diyl-alt-thieno[3,2-b]thiophen-2,5-diyl] (DPP-DTT) thin-film, which is a p-type organic semiconductor material, was formed by spin coating. Accordingly, a bottom gate-structured thin-film transistor was prepared without any electrode.

Next, polydimethylsiloxane (PMDS), an elastic substance in a liquid state, was poured into a mold having a pyramid pattern with a diameter of 30 µm and an interval of 60 µm. The pressure was applied to the mold and the PMDS was dried whereby PMDS having a micropattern was obtained. A surface of the PMDS having the micropattern was coated with single-walled carbon nanotube (SWNT) having the micropattern by using a spray coater. The coating of the SWNT was peeled off by laser processing (patterning in which the PDMS was maintained and only the coated SWNT was peeled off) such that shapes of source and drain electrodes of a transistor were patterned. The patterned electrodes were put on the bottom gate-structured thin-film transistor to prepare a thin-film transistor-based pressure sensor.

EXPERIMENTS

Experiment 1: Evaluation of Pressure Measurement

Figure 5:
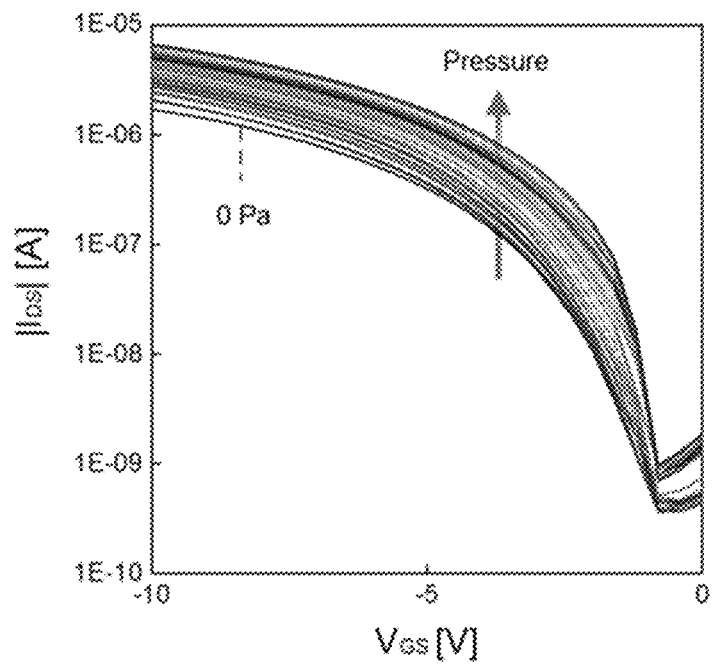
FIG. 5 is a graph showing a result of measuring pressure.

FIG. 5 is a graph showing a result of measuring pressure.

Referring to FIG. 5, it was confirmed that drain current of the pressure sensor prepared in Example 1 was increased as the pressure is applied.

Therefore, it was confirmed that the pressure sensor prepared in Example 1 can measure pressure because the drain current is changed due to changes in a contact area between the electrodes and the semiconductor layer when pressure is applied to the pressure sensor.

Experiment 2: Comparison of the Amount of Current Change According to Change in Pressure FIG. 6 is a graph showing the relative amount of current change depending on pressure.

Figure 6:
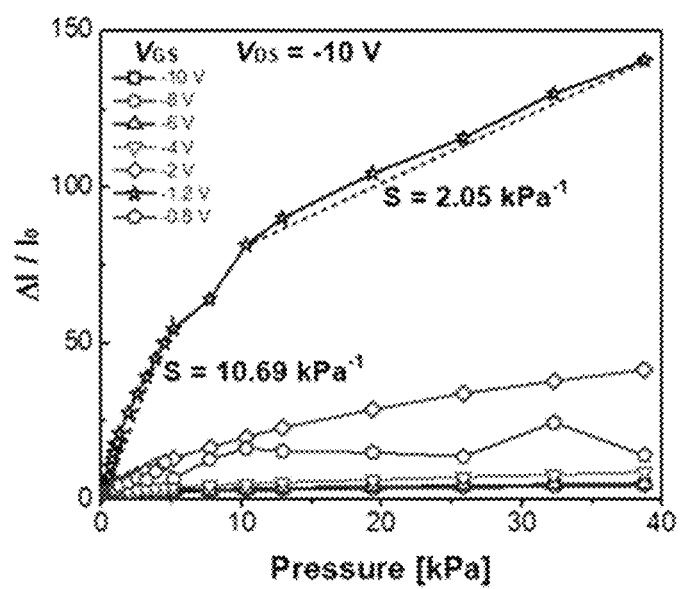
FIG. 6 is a graph showing the amount of current change depending on pressure.

Referring to FIG. 6, a slope of a tangent line of a graph indicates sensitivity, and it was confirmed that the sensitivity changes depending on gate voltage. In particular, it was confirmed that the sensitivity is significantly increased in the subthreshold regime (VGs=−1.2 V), thereby enabling low-power driving. This is because that the pressure sensor according to the present invention is based on change in contact resistance between the semiconductor layer and the source and drain electrodes, and the contact resistance is dominant in the subthreshold regime such that the effect on the current change due to the contact area change is larger.

Experiment 3: Performance Results of Pressure Sensor

Figure 7A:
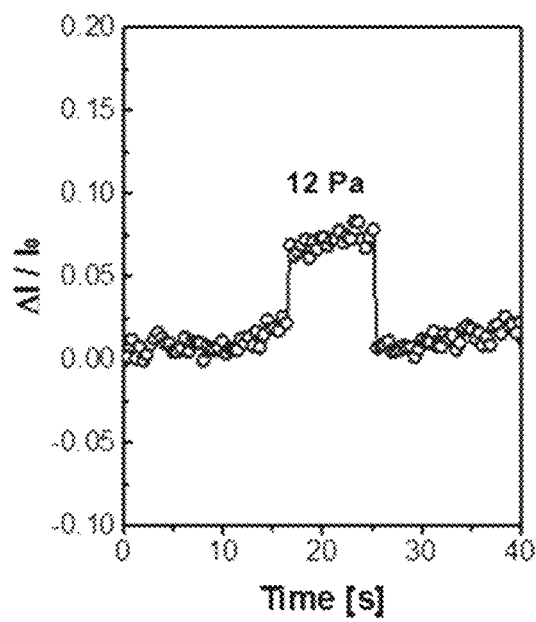
FIG. 7A is a graph showing limit of detection of the pressure sensor in a subthreshold regime.
Figure 7B:
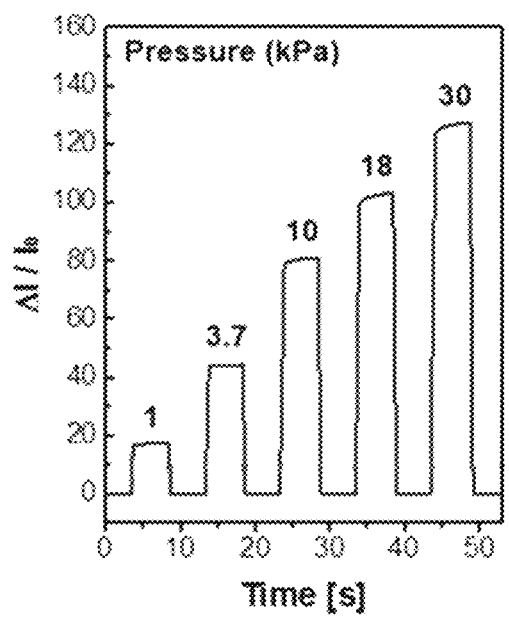
FIG. 7B is a graph showing stability of the pressure sensor in the subthreshold regime.
Figure 7C:
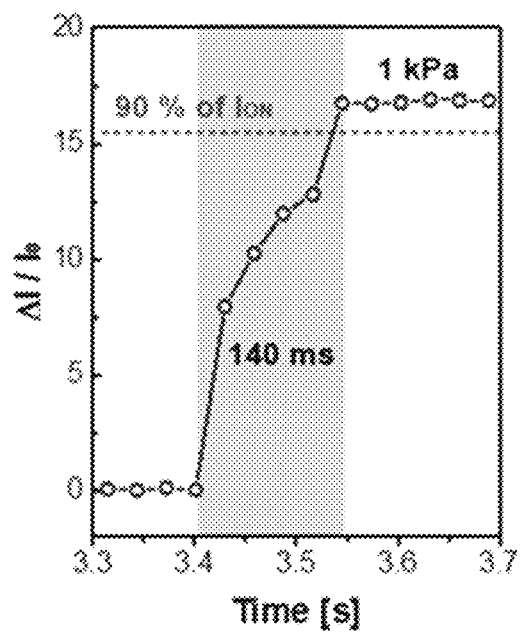
FIG. 7C is a graph showing response time of the pressure sensor in the subthreshold regime.
Figure 7D:
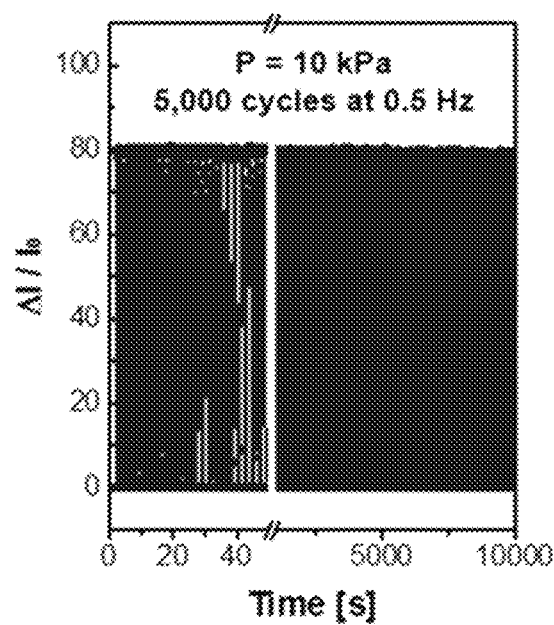
FIG. 7D is a graph showing durability of the pressure sensor in the subthreshold regime.

FIGS. 7A to 7D show the performance of the sensor when the pressure sensor is operated in the subthreshold regime, wherein FIG. 7A is a graph showing limit of detection of the pressure sensor in the subthreshold regime; FIG. 7B is a graph showing stability of the pressure sensor in the subthreshold regime; FIG. 7C is a graph showing response time of the pressure sensor in the subthreshold regime; and FIG. 7D is a graph showing durability of the pressure sensor in the subthreshold regime.

Referring to FIGS. 7A to 7D, it was confirmed that the limit of detection was 12 Pa, the response time was 140 ms, and the pressure sensor operated for 5,000 cycles without performance degradation.

Experiment 4: Low-Power Drive of Pressure Sensor

Figure 8A:
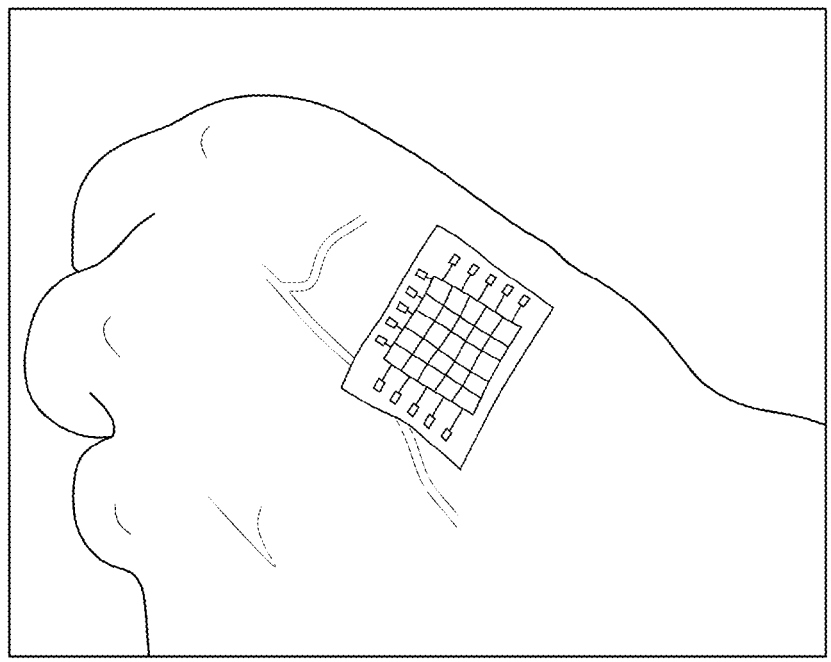
FIGS. 8A and 8B are images each showing a 5×5 (1 cm×1 cm) active matrix array fabricated on a flexible parylene substrate having 3 μm in thickness.
Figure 8B:
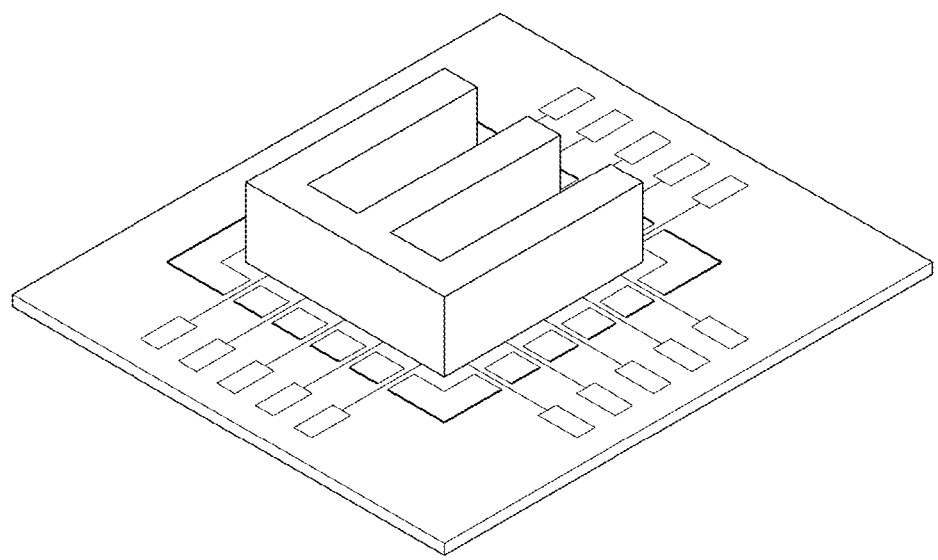
Figure 8C:
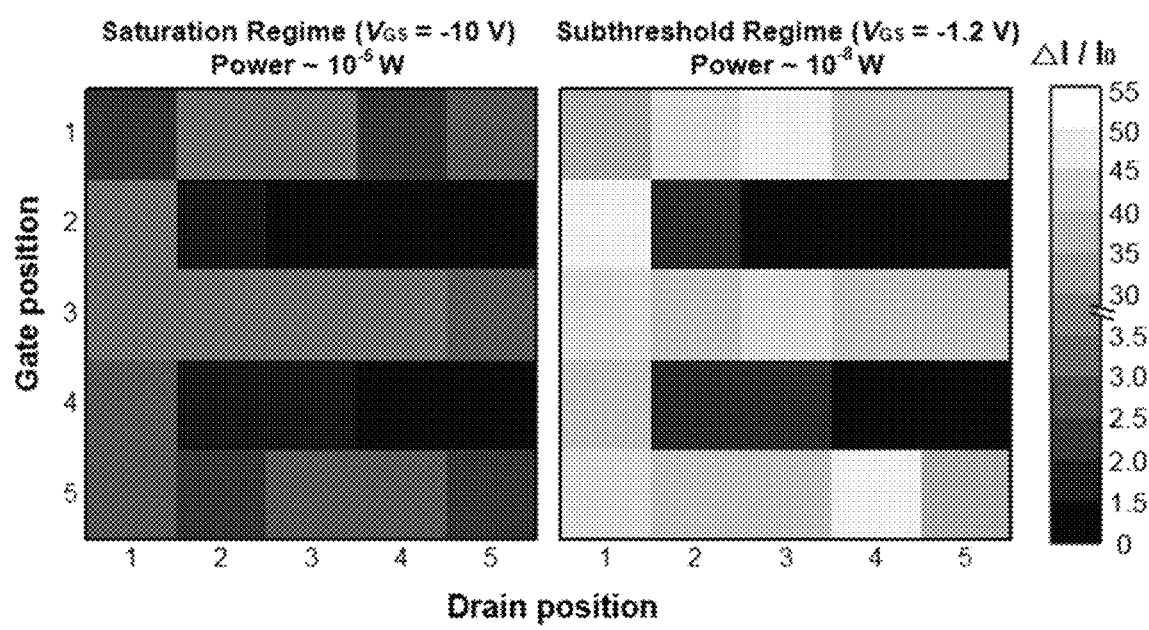
FIG. 8C illustrates two-dimensional contour maps of the character E.

FIGS. 8A and 8B are images each showing a 5×5 (1 cm×1 cm) active matrix array fabricated on a flexible parylene substrate having 3 µm in thickness; and FIG. 8C illustrates two-dimensional contour maps of the character E.

Referring to FIGS. 8A to 8C, it was confirmed that, when the pressure sensor is operated in the subthreshold regime, the pressure sensor showed a high color contrast due to high sensitivity thereof, and it is possible to operate at a low power of 10 nW, which is $1/1000$ of the voltage for the conventional operation regime.

Although the preferred embodiments of the present invention has been described for illustrative purposes, those skilled in the art will appreciate that various modifications, additions, and substitutions are possible, without departing from the scope and spirit of the invention as disclosed in the accompanying claims. For example, each component described as a single type may be realized in a distributed manner, and similarly, components that are described as being distributed may be realized in a coupled manner. The scope of the present invention is defined by the accompanying claims rather than the description which is presented above. Moreover, the present invention is intended to cover not only the exemplary embodiments, but also various alternatives, modifications, equivalents and other embodi-

What is claimed is:

1. A pressure sensor, comprising:
   a gate electrode;
   a gate dielectric layer provided on the gate electrode and having a dielectric;
   a semiconductor layer provided on the gate dielectric layer and having a semiconductor; and
   a source electrode and a drain electrode provided on the semiconductor layer,
   wherein the source electrode has an elastic body that includes: a first elastic part having a first protrusion that protrudes toward the semiconductor layer; and a first conductive part embedded in a surface of the first elastic part and having a conductive material, and
   the drain electrode has an elastic body that includes: a second elastic part having a second protrusion that protrudes toward the semiconductor layer; and a second conductive part embedded in a surface of the second elastic part and having a conductive material,
   wherein each of the first protrusion and the second protrusion has a shape of a polygonal pyramid,
   wherein the pressure sensor operates in a subthreshold regime and senses pressure.

2. The pressure sensor of claim 1, wherein each of the first protrusion and the second protrusion has a shape whose cross-sectional area becomes smaller as each of the first protrusion and the second protrusion approaches the semiconductor layer.

3. The pressure sensor of claim 1, wherein at least one of the first protrusion and the second protrusion is independently deformed as contraction pressure acts in a direction perpendicular to the first or second conductive part whereby a contact area between the semiconductor and the at least one of the first protrusion and the second protrusion is increased.

4. The pressure sensor of claim 1, wherein the elastic body includes at least one selected among the group consisting of polydimethylsiloxane (PDMS), ecoflex, silicone rubber, fluorosilicone rubber, vinyl methyl silicone rubber, styrene-butadiene rubber, styrene-ethylene-butylene-styrene rubber, acryl rubber, butadiene rubber, chloro isobutylene isoprene rubber, polychloroprene rubber, epichlorohydrin rubber, ethylene propylene rubber, ethylene propylene diene rubber, polyether urethane rubber, polyisoprene rubber, isobutylene isoprene butyl rubber, acrylonitrile butadiene rubber, and polyurethane rubber.

5. The pressure sensor of claim 1, wherein the elastic body has an elastic modulus of 1 MPa to 1,000 MPa.

6. The pressure sensor of claim 1, wherein the conductive material includes at least one selected among the group consisting of carbon nanotube (CNT), carbon black, graphene, graphite, poly(3,4-ethylenedioxythiophene) (PEDOT), aluminium (Al), gold (Au), copper (Cu), silver (Ag), titanium (Ti), and platinum (Pt).

7. The pressure sensor of claim 1, wherein the pressure sensor is configured such that current of the drain electrode is changed as a contact area between the protrusion and the semiconductor layer varies according to change in pressure.

8. The pressure sensor of claim 1, wherein the pressure sensor operates in the subthreshold regime and senses pressure, thereby having high sensitivity and being driven by low power.

9. The pressure sensor of claim 1, further comprising: a substrate on a surface of the gate electrode, the surface being opposite to the gate dielectric layer.

10. The pressure sensor of claim 9, wherein the substrate includes at least one selected among the group consisting of silicon, glass, polymer, and metal.

11. The pressure sensor of claim 10, wherein the polymer includes at least one selected among the group consisting of poly(ethylene 2,6-naphthalate) (PEN), poly(ethylene terephthalate) (PET), polyimide (PI), polyethersulfone, polyacrylate, polyetherimide, polyphenylene sulfide, polyarylate, polyimide, polycarbonate, cellulose triacetate, and cellulose acetate propionate.

12. The pressure sensor of claim 1, wherein the gate electrode includes at least one selected among the group consisting of aluminium (Al), gold (Au), copper (Cu), silver (Ag), titanium (Ti), platinum (Pt), graphene, carbon nanotube (CNT), PEDOT: PSS, and silver nanowire.

13. The pressure sensor of claim 1, wherein the gate dielectric layer includes at least one selected among the group consisting of parylene, polydimethylsiloxane (PDMS), Cytop, polystyrene (PS), poly(methyl methacrylate) (PMMA), poly(vinyl pyrrolidone) (PVP), polyimide (PI), $SiO_2$, $Al_2O_3$, $HfO_2$, $ZrO_2$, $Y_2O_3$, and $Ta_2O_5$.

14. The pressure sensor of claim 1, wherein the semiconductor layer includes at least one selected among the group consisting of an n-type organic semiconductor, a p-type organic semiconductor, and an oxide semiconductor.

15. A pressure sensor, comprising:
   a gate electrode;
   a gate dielectric layer provided on the gate electrode and having a dielectric;
   a semiconductor layer provided on the gate dielectric layer and having a semiconductor; and
   a patterned source electrode and a patterned drain electrode provided on the semiconductor layer,
   wherein the patterned source electrode has an elastic body that includes: a first patterned elastic part having a first protrusion that protrudes toward the semiconductor layer; and a first conductive part embedded in a surface of the first patterned elastic part and having a conductive material, and
   the patterned drain electrode has an elastic body that includes: a second patterned elastic part having a second protrusion that protrudes toward the semiconductor layer; and a second conductive part embedded in a surface of the second patterned elastic part and having a conductive material,
   wherein each of the first protrusion and the second protrusion has a shape of a polygonal pyramid,
   wherein the pressure sensor operates in a subthreshold regime and senses pressure.

16. A method of manufacturing a pressure sensor, the method comprising:
   forming a gate electrode;
   forming a gate dielectric layer having a dielectric on the gate electrode;
   forming a semiconductor layer having a semiconductor on the gate dielectric layer such that a first portion in which the gate electrode, the gate dielectric layer, and the semiconductor layer are configured sequentially is provided;
   forming a source electrode and a drain electrode such that a second portion in which the source electrode and the drain electrode are configured is provided; and
   positioning the second portion on the semiconductor layer of the first portion such that a pressure sensor is manufactured,
   wherein the source electrode has an elastic body that includes: a first elastic part having a first protrusion that protrudes toward the semiconductor layer; and a first conductive part embedded in a surface of the first elastic part and having a conductive material, and the drain electrode has an elastic body that includes: a second elastic part having a second protrusion that protrudes toward the semiconductor layer; and a second conductive part embedded in a surface of the second elastic part and having a conductive material, wherein each of the first protrusion and the second protrusion has a shape of a polygonal pyramid, wherein the pressure sensor operates in a subthreshold regime and senses pressure.

17. The method of claim 16, wherein the forming of the source electrode and the drain electrode includes:

introducing an elastic substance into a mold having a pattern to form the elastic part included in the elastic body and having the protrusion; and coating a surface of the elastic part having the protrusion with a conductive material to form the conductive part including the conductive material embedded in the surface of the elastic part such that the source electrode and the drain electrode are manufactured, wherein each of the protrusion have a shape of a polygonal pyramid.

18. The method of claim 17, wherein the coating of the elastic part is performed by any one of method selected from spray coating, sputtering, spin coating, thermal evaporation, electroless plating, and transferring of electrode layer.

* * * * *